(12) United States Patent
Bedell et al.

(10) Patent No.: US 10,770,614 B2
(45) Date of Patent: *Sep. 8, 2020

(54) MONOLITHICALLY INTEGRATED HIGH VOLTAGE PHOTOVOLTAICS AND LIGHT EMITTING DIODE WITH TEXTURED SURFACE

(71) Applicant: INTERNATIONAL BUSINESS MACHINES CORPORATION, Armonk, NY (US)

(72) Inventors: Stephen W. Bedell, Wappingers Falls, NY (US); Ning Li, White Plains, NY (US); Devendra K. Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/391,590

(22) Filed: Apr. 23, 2019

(65) Prior Publication Data

US 2019/0252573 A1 Aug. 15, 2019

Related U.S. Application Data

(63) Continuation of application No. 15/943,151, filed on Apr. 2, 2018, now Pat. No. 10,355,164, which is a
(Continued)

(51) Int. Cl.
*H01L 33/00* (2010.01)
*H01L 31/0236* (2006.01)
(Continued)

(52) U.S. Cl.
CPC .......... *H01L 33/007* (2013.01); *H01L 25/167* (2013.01); *H01L 31/02363* (2013.01);
(Continued)

(58) Field of Classification Search
CPC ............. H01L 31/02363; H01L 31/147; H01L 31/1848; H01L 31/03048; H01L 31/03044;
(Continued)

(56) References Cited

U.S. PATENT DOCUMENTS

8,940,580 B2 * 1/2015 Hekmatshoartabari ......................
H01L 31/0687
438/107
9,985,164 B1 * 5/2018 Bedell ............... H01L 31/03529
(Continued)

*Primary Examiner* — Hsien Ming Lee
(74) *Attorney, Agent, or Firm* — Tutunjian & Bitetto, P.C.; Erik Johnson (57) ABSTRACT

A method of forming an electrical device that includes epitaxially growing a first conductivity type semiconductor material of a type III-V semiconductor on a semiconductor substrate. The first conductivity type semiconductor material continuously extending along an entirety of the semiconductor substrate in a plurality of triangular shaped islands; and conformally forming a layer of type III-V semiconductor material having a second conductivity type on the plurality of triangular shaped islands to provide a textured surface of a photovoltaic device. A light emitting diode is formed on the textured surface of the photovoltaic device.

20 Claims, 5 Drawing Sheets

Related U.S. Application Data continuation of application No. 15/832,926, filed on Dec. 6, 2017, now Pat. No. 9,985,164, which is a continuation of application No. 15/486,941, filed on Apr. 13, 2017, now Pat. No. 9,991,408.

(51) Int. Cl.

| | |
|---|---|
| *H01L 31/18* | (2006.01) |
| *H01L 33/32* | (2010.01) |
| *H01L 31/0352* | (2006.01) |
| *H01L 31/0693* | (2012.01) |
| *H01L 31/12* | (2006.01) |
| *H01L 31/153* | (2006.01) |
| *H01L 25/16* | (2006.01) |
| *H01L 33/22* | (2010.01) |
| *H01L 33/06* | (2010.01) |

(52) U.S. Cl.
CPC .... *H01L 31/03529* (2013.01); *H01L 31/0693* (2013.01); *H01L 31/125* (2013.01); *H01L 31/153* (2013.01); *H01L 31/1852* (2013.01); *H01L 31/1856* (2013.01); *H01L 33/06* (2013.01); *H01L 33/22* (2013.01); *H01L 33/32* (2013.01); *Y02E 10/544* (2013.01); *Y02P 70/521* (2015.11)

(58) Field of Classification Search
CPC .. H01L 31/185; H01L 33/0062; H01L 33/007
See application file for complete search history.

(56) References Cited

U.S. PATENT DOCUMENTS

| | | | |
|---|---|---|---|
| 9,991,408 B1* | 6/2018 | Bedell | H01L 31/03529 |
| 10,256,365 B2* | 4/2019 | Bedell | H01L 31/03529 |
| 10,355,164 B2* | 7/2019 | Bedell | H01L 33/22 |
| 2018/0174761 A1* | 6/2018 | Kamino | H01L 51/4226 |

* cited by examiner

MONOLITHICALLY INTEGRATED HIGH VOLTAGE PHOTOVOLTAICS AND LIGHT EMITTING DIODE WITH TEXTURED SURFACE

BACKGROUND

Technical Field

The present invention generally relates to photovoltaic devices, and more particularly to photovoltaic devices used to power light emitting diodes.

Description of the Related Art

A photovoltaic device is a device that converts the energy of incident photons to electromotive force (e.m.f.). Photovoltaic devices include solar cells, which are configured to convert the energy in the electromagnetic radiation from the sun to electric energy. A light-emitting diode (LED) is a two-lead semiconductor light source. It is a p-n junction diode, which emits light when activated. When a suitable voltage is applied to the leads to the LED, electrons are able to recombine with electron holes within the device, releasing energy in the form of photons. This effect is called electroluminescence, and the color of the light (corresponding to the energy of the photon) is determined by the energy band gap of the semiconductor.

SUMMARY

In one aspect, a method of forming an electronic device is described herein, in which the electronic device is composed of a photovoltaic device and a light emitting device, in which one of the devices includes bandgap materials. In some embodiments, the method may include epitaxially growing a first conductivity type semiconductor material of a type III-V semiconductor on a substrate, the first conductivity type semiconductor material continuously extending along an entirety of the semiconductor substrate in a plurality of triangular shaped islands; and conformally forming a layer of type III-V semiconductor material having a second conductivity type on the plurality of triangular shaped islands, wherein the texture of the plurality of triangular shaped islands extends through the layer of the type III-V semiconductor material having the second conductivity type to provide a textured surface of a photovoltaic device. In a following process sequence, a light emitting diode is formed on the textured surface of the photovoltaic device. In some embodiments, the bandgap of the material layers in the light emitting diode (LED) is wider than the bandgap of the material layers in the photovoltaic device.

In another embodiment, a method of forming a photovoltaic device including wide bandgap materials is described. In one embodiment, the method includes forming a textured surface on a substrate, the textured surface including a plurality of triangular shaped peaks. In some embodiments, the method continuous with conformally forming a first conductivity type III-V semiconductor material on the textured surface of the substrate. Thereafter, a second conductivity type III-V semiconductor material is conformally formed on the first conductivity type III-V semiconductor to produce a textured surface for the photovoltaic device. In a following process sequence, a light emitting diode is formed on the textured surface of the photovoltaic device. In some embodiments, the bandgap of the material layers in the light emitting diode (LED) is wider than the bandgap of the material layers in the photovoltaic device.

In another aspect, an electrical device is provided that is composed of a material stack including a photovoltaic device and a light emitting device, in which at least one material layer in each of the photovoltaic device and the light emitting device is textured. In one embodiment, a first type III-V semiconductor material having a first conductivity type for a junction of a photovoltaic device is in direct contact with a planar surface of a substrate. The first type III-V semiconductor material having the first conductivity type is a continuous layer of triangular geometry islands that are in contact end to end. A conformal layer of second type III-V semiconductor material having a second conductivity type for the junction of the photovoltaic device is in direct contact with the first type III-V semiconductor material to provide a p-n junction, wherein the conformal layer over the continuous layer of triangular geometry islands provides the textured surface for the photovoltaic device. A light emitting diode is formed on the textured surface of the photovoltaic device. In some embodiments, the bandgap of the material layers in the light emitting diode (LED) is wider than the bandgap of the material layers in the photovoltaic device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides photovoltaic cells, i.e., photovoltaic devices, needed for internet of things (IOT) applications that also include light emitting diodes (LEDs). As used herein, a "photovoltaic device" is a device, such as a solar cell, that produces free electrons and/or vacancies, i.e., holes, when exposed to radiation, such as light, and results in the production of an electric current. A multi-junction photovoltaic device typically includes a multiple junctions of a semiconductor layer of a p-type conductivity that shares an interface with a semiconductor layer of an n-type conductivity, in which the interface provides an electrical junction. As used herein, the term "LED" denotes a semiconductor material containing structure that emits light when an electrical current is passed through it. In some embodiments, the light-emitting diode (LED) is a two-lead semiconductor light source, which can resemble a pn-junction diode. In this example, when a voltage is applied to the leads to the pn-junction type diode, electrons are able to recombine with electron holes within the device, releasing energy in the form of photons. This effect is called electroluminescence, and the color of the light (corresponding to the energy of the photon) is determined by the energy band gap of the semiconductor.

Physically small, i.e., devices with a small footprint, having high voltage requirements are needed. The length and width dimensions of the monolithically formed devices of high voltage photovoltaics integrated with LEDS that are described herein may be no greater than 150 microns, e.g, may be equal to 100 microns or less.

In some embodiments, the voltage requirements can be met by photovoltaic cells having textured surfaces, as depicted in FIGS. 1A-3B. The voltage requirements for a photovoltaic device of this type may be between 2 volts and 3 volts to drive light emitting diodes (LEDs) for communication applications. The voltage requirements to write and read memory cells may range from 2 volts to 3.5 volts. In battery applications, the photovoltaic devices may need to provide 3.5 volts to charge a battery.

In some embodiments, an integrated LED is needed to send signal to outside the device. Monolithically integrated LEDs with photovoltaic devices can reduce size W1 of an electrical device that includes an LED that is separate from a photovoltaic device or other power source. In some embodiments, the structures and methods disclosed herein provide a high voltage photovoltaic device that is integrated with an LED that may be used for energy harvesting and communication, in which the integrated device is formed using semiconductor growth processes, which may include growth processes using low hydrogen content precursors.

In some embodiments, the structures and methods disclosed herein provide a high voltage photovoltaic device using wide bandgap semiconductor materials in combination with a growth and/or etching method that produces a surface texture for improved voltage and power output in a small footprint. The textured surface is present at the light receiving end of the photovoltaic device, as well as the light receiving end of the LED. Additionally, in some embodiments, the band gap of the material layers in the sequence of material layers for the photovoltaic device and the light emitting device may be selected so that the material layers of the photovoltaic device to not absorb the wavelengths of light produced by the LED. In other embodiments, the band gap of the material layers in the sequence of material layers for the photovoltaic device and the light emitting device may be selected so that the material layers of the LED device do not absorb the wavelengths of light being transmitted to the photovoltaic device for the purpose of producing voltage. In some embodiments, the LED device 55 is positioned in closer proximity to the light receiving end S1 of the device than the photovoltaic device 50, as illustrated in FIGS. 1A, 1B, 2A, 2B, 3A and 3B. In other embodiments, the photovoltaic device 50 is positioned in closer proximity to the light receiving end S1 of the device than the LED device 55, as illustrated in FIGS. 1C and 2C. The methods and structures of the present disclosure are now described in greater detail with reference to FIGS. 1A-3B.

In some embodiments, the method of forming an electrical device including a stacked structure of the LED device 15 and the photovoltaic device 10 having the textured surfaces may begin with providing a substrate 5a, 5a', 5b, 5b', as depicted in FIGS. 1A-3B. In one embodiment, the substrate 5a may be a type IV semiconductor substrate, such as a silicon-containing substrate 5a. For example, the substrate may be composed of crystalline silicon (c-Si), e.g., polycrystalline silicon or single crystalline silicon, also referred to a monocrystalline silicon. In another embodiment, the substrate 5b may be composed of sapphire ($Al_2O_3$).

In some embodiments, the photovoltaic device 50 is first formed on the substrate 5a, 5a', 5b, 5b', as depicted in FIGS. 1A, 1B, 2A, 2C and 3A-3B. In some embodiments, the method may include epitaxially growing a first conductivity type semiconductor material of a type III-V semiconductor on the substrate 5a, 5b for providing the first doped layer of the junction that provides the photovoltaic device 50. The term "conductivity type" denotes whether a material is a p-type or n-type semiconductor material. As used herein, "p-type" refers to the addition of impurities to an intrinsic semiconductor that creates deficiencies of valence electrons. As used herein, "n-type" refers to the addition of impurities that contributes free electrons to an intrinsic semiconductor. The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

In a type III-V semiconductor material, the effect of the dopant atom, i.e., whether it is a p-type or n-type dopant, depends upon the site occupied by the dopant atom on the lattice of the base material. In a III-V semiconductor material, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities.

Figure 1A:
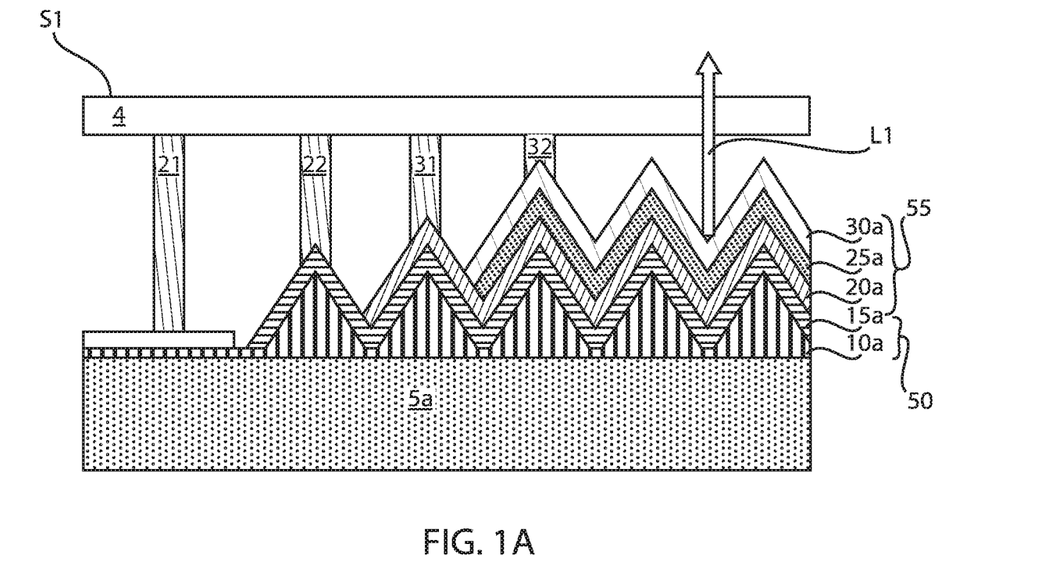
FIG. 1A is a side cross-sectional view showing one embodiment of an electrical device including a photovoltaic device having a textured upper surface, in which the junction for the photovoltaic device includes a continuous layer of n-type gallium nitride islands having a triangular shaped geometry atop a silicon containing substrate and a conformal p-type gallium nitride layer atop the n-type gallium nitride islands, wherein a light emitting diode composed of a gallium nitride cladding layers and a quantum well of gallium nitride and indium gallium nitride is present atop the photovoltaic device.
Figure 1B:
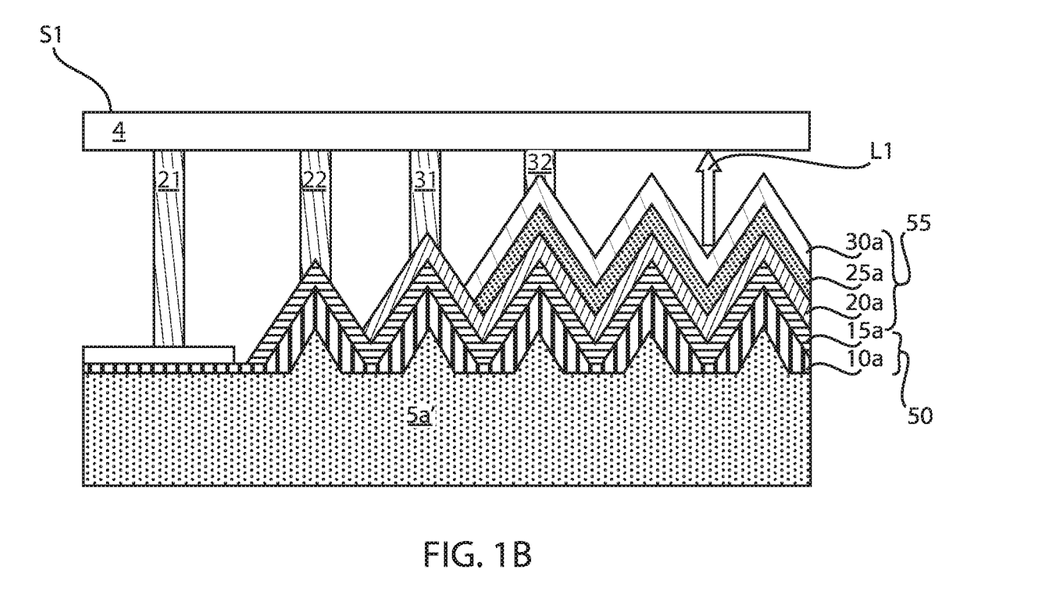
FIG. 1B is a side cross-sectional view showing one embodiment of an electronic device including a photovoltaic device having a silicon substrate with a textured surface and a junction of p-type gallium nitride layer and n-type gallium nitride layer present atop the textured surface of the substrate, the junction also having a textured upper surface, wherein a light emitting diode composed of a gallium nitride cladding layers and a quantum well of gallium nitride and indium gallium nitride is present atop the photovoltaic device.
Figure 1C:
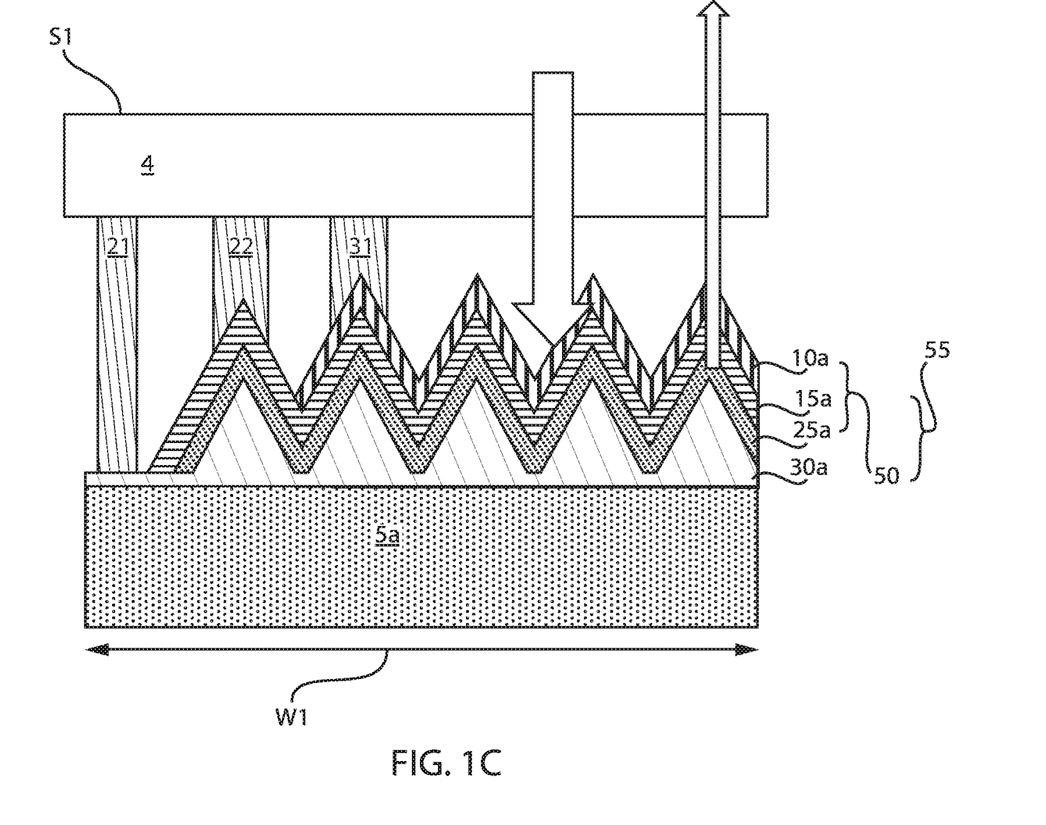
FIG. 1C is a side cross-sectional view of another embodiment of an electronic device including a photovoltaic device and a light emitting diode device in a material stack atop a silicon containing substrate, wherein the photovoltaic device is composed of material layers of gallium nitride, and the light emitting diode is composed of a gallium nitride cladding layers and a quantum well of gallium nitride and indium gallium nitride, wherein the photovoltaic device is closer to the light receiving end of the material stack.
Figure 2A:
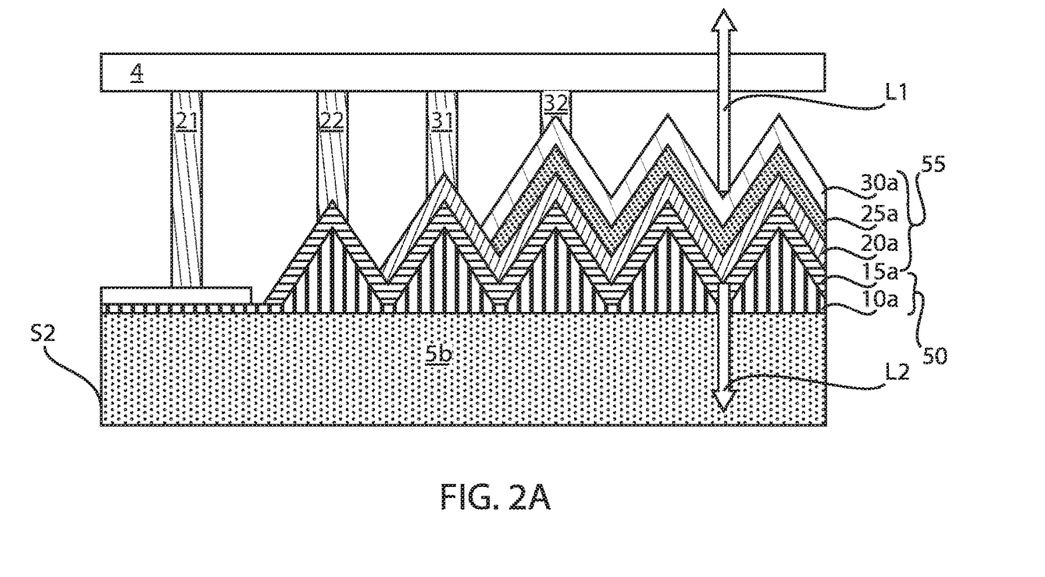
FIG. 2A is a side cross-sectional view showing one embodiment of an electronic device including a photovoltaic device having a textured upper surface, in which the junction for the photovoltaic device includes a continuous layer of n-type gallium nitride islands having a triangular shaped geometry atop a substrate composed of sapphire and a conformal p-type gallium nitride layer atop the n-type gallium nitride islands, wherein a light emitting diode composed of a gallium nitride cladding layers and a quantum well of gallium nitride and indium gallium nitride is present atop the photovoltaic device.
Figure 2B:
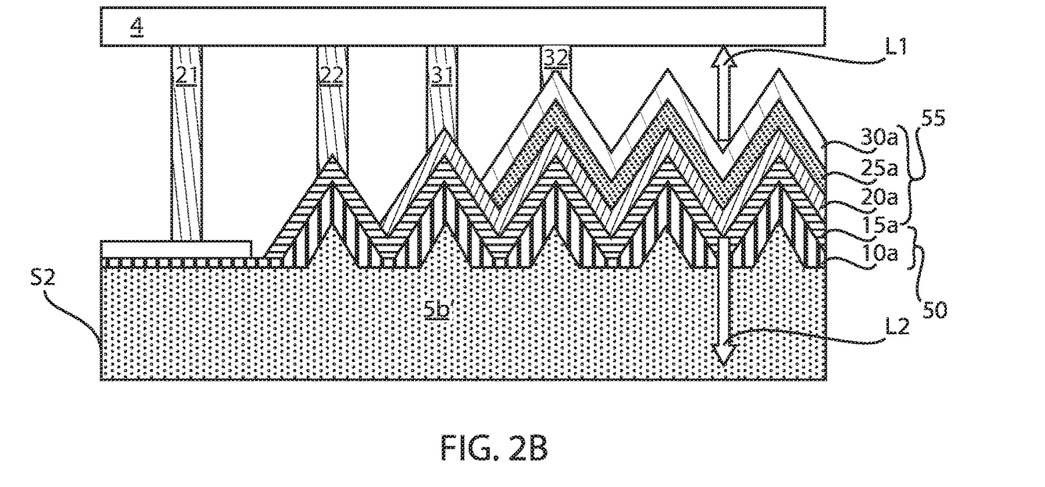
FIG. 2B is a side cross-sectional view showing one embodiment of an electronic device including a photovoltaic device having a sapphire substrate with a textured surface and a junction of p-type gallium nitride layer and n-type gallium nitride layer present atop the textured surface of the substrate, the junction also having a textured upper surface, wherein a light emitting diode composed of a gallium nitride cladding layers and a quantum well of gallium nitride and indium gallium nitride is present atop the photovoltaic device.
Figure 2C:
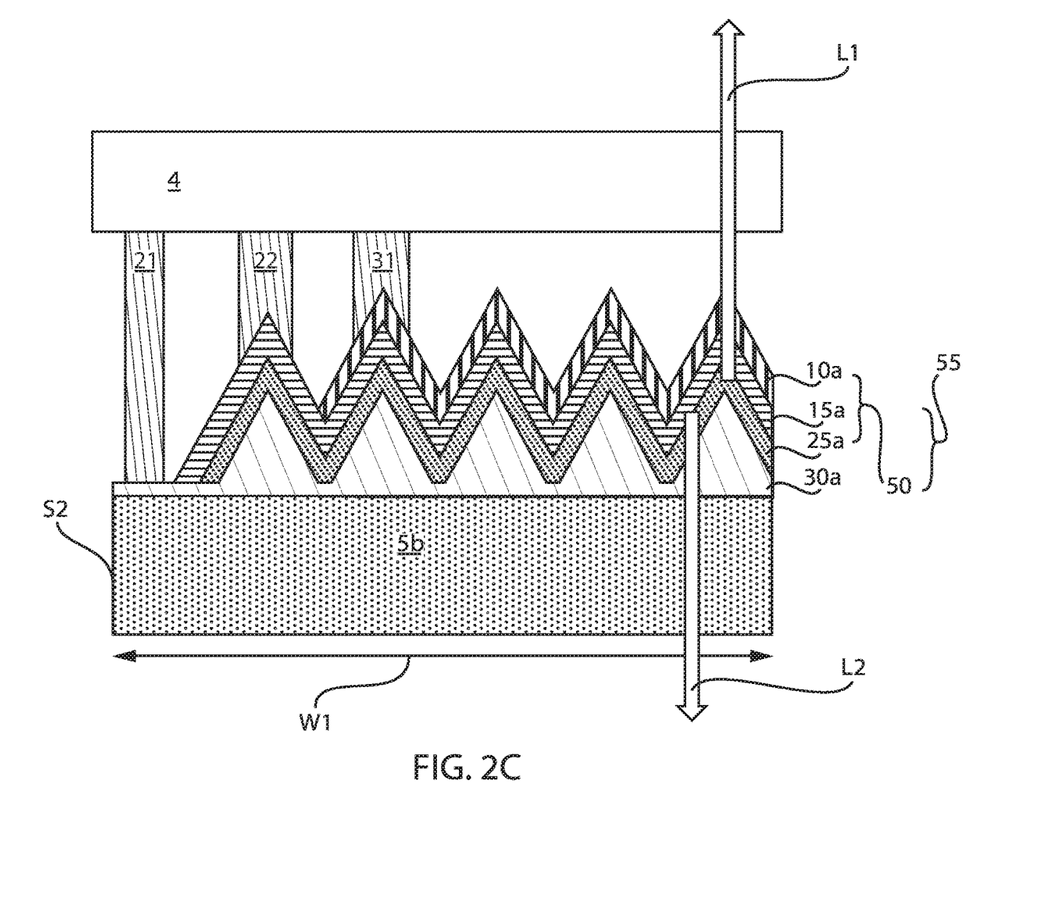
FIG. 2C is a side cross-sectional view of another embodiment of an electronic device including a photovoltaic device and a light emitting diode device in a material stack atop a sapphire substrate, wherein the photovoltaic device is composed of material layers of gallium nitride, and the light emitting diode is composed of a gallium nitride cladding layers and a quantum well of gallium nitride and indium gallium nitride, wherein the photovoltaic device is closer to the light receiving end of the material stack.
Figure 3A:
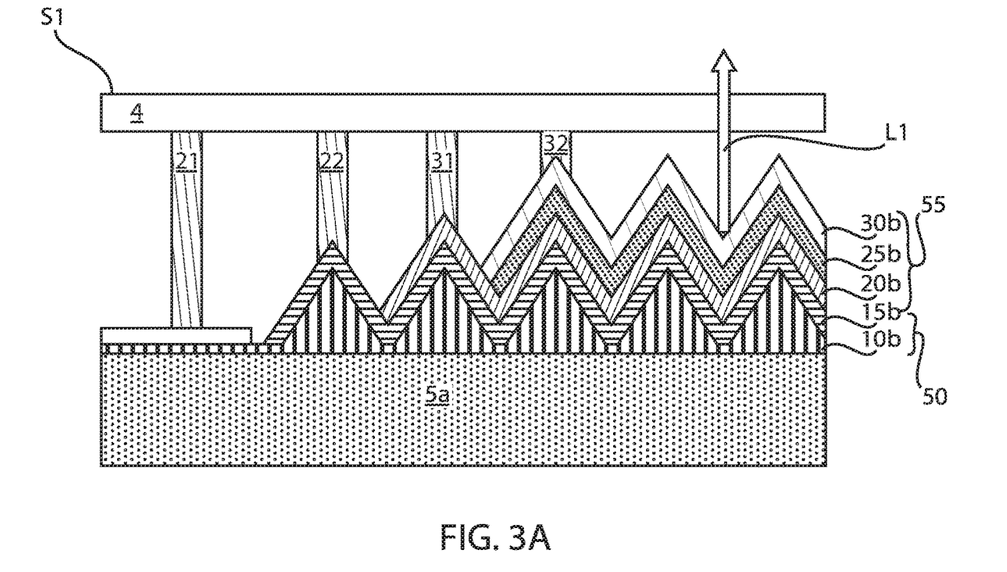
FIG. 3A is a side cross-sectional view showing one embodiment of an electronic device including a photovoltaic device having a textured upper surface, in which the junction for the photovoltaic device includes a continuous layer of n-type aluminum gallium nitride islands having a triangular shaped geometry atop a silicon substrate and a conformal p-type aluminum gallium nitride layer atop the n-type aluminum gallium nitride islands, wherein a light emitting diode composed of an aluminum gallium nitride cladding layers and a quantum well of gallium nitride and aluminum gallium nitride is present atop the photovoltaic device.
Figure 3B:
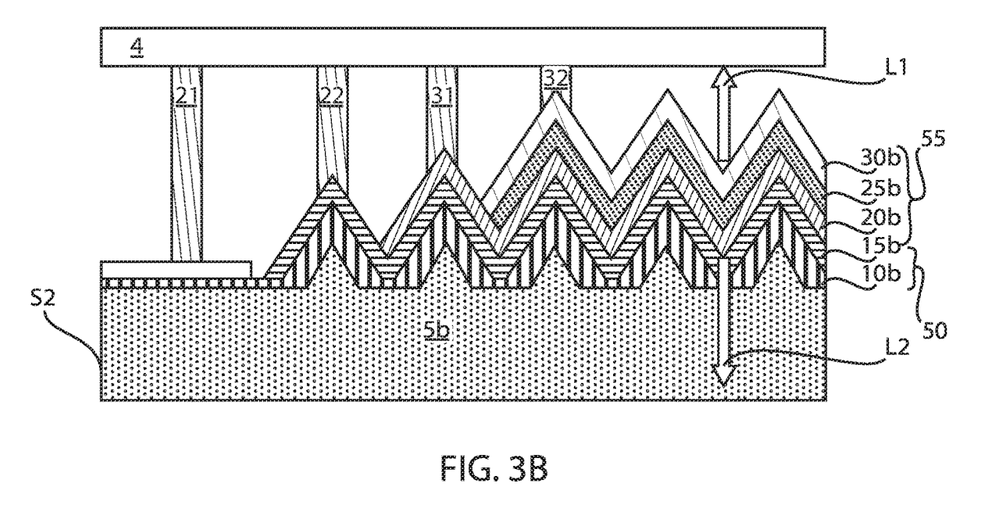
FIG. 3B is a side cross-sectional view showing one embodiment of an electronic device including a photovoltaic device having a sapphire containing substrate with a textured surface and a junction of p-type aluminum gallium nitride layer and n-type aluminum gallium nitride layer present atop the textured surface of the substrate, the junction also having a textured upper surface, wherein a light emitting diode composed of an aluminum gallium nitride cladding layers and a quantum well of gallium nitride and aluminum gallium nitride is present atop the photovoltaic device.

In the embodiment depicted in FIGS. 1A and 1B, the first conductivity type semiconductor material of a type III-V semiconductor is an n-type gallium nitride layer 10a having islands of a triangular geometry that is present on a silicon substrate 5a, 5a', as depicted in FIGS. 1A and 2A. In some other embodiments, the first conductivity type semiconductor material of a type III-V semiconductor is an n-type gallium nitride layer 10a having islands of a triangular geometry that is present on a sapphire substrate 5b, 5b' as depicted in FIGS. 2A and 2B. Gallium nitride (GaN) has a band gap of approximately 3.4 eV. In FIGS. 3A and 3B, the first conductivity type semiconductor material of a type III-V semiconductor is an n-type aluminum gallium nitride layer 10b having islands of a triangular geometry that is present on a silicon substrate 5a or a sapphire substrate 5b, respectively. The band gap for aluminum gallium nitride (AlGaN) is on the order of 4 eV. The triangular shaped geometry that is depicted in the cross-sections illustrated in FIGS. 1A-3B may also be referred to as pyramids.

In each of the embodiments depicted in FIGS. 1A, 2A, 3A and 3B, the first conductivity type semiconductor material 10a, 10b is formed on a substrate 5a, 5b having a planar upper surface, continuously extends along an entirety of the planar substrate surface in a plurality of triangular shaped islands. The triangular shaped islands have base surface in direct contact with the substrate 5a, 5b, and two sidewalls S1, S2 that are substantially straight extending from ends of the base surface and intersecting at an apex A1. In some embodiments, the apex A1 of the triangular geometry of first conductivity type semiconductor material 10a, 10b, 10c is positioned at a center of the width of the base surface. The term "continuous" as used to describe the layer of triangular shaped islands that provide the first conductivity type semiconductor material 10a, 10b means that the triangular shaped islands that are adjacent to one another contact each other end to end at the edges of the base surfaces of the triangular shaped islands.

In each of the embodiments depicted in FIGS. 1B and 2B, the substrate 5a', 5b' is textured. In these embodiments, the texture of the upper surface of the substrate may have an apex similar and sidewall structure similar to a triangle, and can be referred to as a pyramid. In these embodiments, by conformally depositing the material layers for the p-n junction on the textured surface of the substrate 5a', 5b', the texture is communicated from the upper surface of the substrate 5a', 5b'; through the p-n junction so that the upper surface of the p-n junction is textured similar to the substrate 5a', 5b'. It is noted that the textured substrate depicted in FIGS. 1A and 2B may also be applied to the embodiments that are illustrated having a substrate with planar upper surface in FIGS. 1C, 2C and 3A-3B.

Forming the first conductivity type semiconductor material of a type III-V semiconductor can begin with preparing the substrate 5a, 5b to be conductive for forming the islands of the triangular shaped geometry thereon. For example, referring to FIGS. 1B, 3B, and 5B, in the case of a Si-based substrate material, e.g., silicon containing substrate 5a', the pyramids can be formed using an etchant with crystal plane selectivity. For example, potassium hydroxide (KOH) etching is can be used to form pyramidal surface structures on the silicon substrate 5a'. In some embodiments, the silicon substrate 5a' crystal orientation is selected to be <111> when used for GaN growth, as depicted in FIG. 1B, in which the first conductivity type semiconductor material of a type III-V semiconductor is an n-type gallium nitride layer 10a having islands of a triangular geometry that is formed on a silicon substrate 5a'.

In the case of sapphire ($Al_2O_3$) substrates 5b', as depicted in FIG. 2B, the texturing is performed using lithographic definition of the pattern array, followed by dry etching to form pyramids. Some embodiments of dimensions for the pyramids are between 0.5 and 5 um tall and from 1 to 10 um wide at the base. The sapphire crystal orientation is usually <0001> "c-axis", although m-axis (semi-polar) orientations are considered as well.

In other embodiments, the textured surface is using a 2-step growth process wherein a first layer of III-V semiconductor material is grown, i.e., epitaxially formed, on a planar upper surface of the substrate 5a, 5b, i.e., silicon or sapphire substrate, as depicted in FIGS. 1A-1B and FIGS. 2A-2B. For example, a first layer of III-V semiconductor material, such as n-type gallium nitride can be grown, e.g., epitaxially grown, to a thickness ranging from 0.5 microns to 10 microns. Thereafter, the substrate 5a, 5b including the first layer of the III-V semiconductor material that has been epitaxially formed thereon can be removed from the growth chamber of the epitaxial deposition apparatus, and can be either wet or dry etched to form a textured surface. Examples of wet etch chemistries suitable for etching gallium nitride (GaN) into a continuous layer of islands having a triangular geometry can include potassium hydroxide (KOH) or hydrogen peroxide ($H_3PO_4$). Some embodiments of dimensions of the pyramids, i.e., each island having a triangular geometry, are between 0.5 microns and 5 microns tall and from 1 to 10 microns wide at the base. It is noted that although a substrate 5a', 5b' having a textured surface is only depicted in FIGS. 1B and 2B, this texturing process step may be equally applied to the embodiments depicted in FIGS. 1B and 2C and FIGS. 3A and 3B.

The material layers of the lower layer of the junction, i.e., the n-type gallium nitride layer 10a, and the n-type aluminum gallium nitride layer 10b may be formed using epitaxial growth. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The lower layer for the p-n junction may be formed by metal organic chemical vapor deposition (MOCVD) or molecular beam epitaxy (MBE). In some embodiments, the lower layer for the p-n junction may be formed using a low hydrogen deposition process. The term "low hydrogen" denotes that the deposition step has a maximum hydrogen content of $1 \times 10^{18}$ cm$^{-3}$.

MBE growth processes can include heat the substrate, typically to some hundreds of degrees (for example, 500° C.-600° C.) in the case of gallium nitride). In a following step, MBE growth processes include a precise beam of atoms or molecules (heated up so they're in gas form) being fired at the substrate from "guns" called effusion cells. The composition of the molecules being fired in the beams provide the composition of the deposited material layer. The molecules land on the surface of the substrate, condense, and build up systematically in ultra-thin layers, so that the material layer being grown forms one atomic layer at a time.

Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In some preferred embodiments, the CVD process used to form the lower junction may be metal organic chemical vapor deposition.

A number of different sources may be used for the deposition of epitaxial type III-V semiconductor material. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), Trimethylaluminum (TMA), tertiary-butylphosphine (TBP), phosphine ($PH_3$), ammonia ($NH_3$), and combinations thereof. The temperature for epitaxial deposition of type III-V semiconductor materials typically ranges from 550° C. to 900° C. Although higher temperature typically results in faster deposition, the faster deposition may result in crystal defects and film cracking.

The material layers for the lower layer of the p-n junction may be doped n-type or p-type using in situ doping. In the examples depicted in FIGS. 1A-3B, the lower layer of the p-n junction that is present on the substrate is n-type doped. By "in-situ" it is meant that the dopant that provides the conductivity type of the material layer, e.g., material layer that contributes to providing a junction, is introduced as the material layer is being formed. To provide for in-situ doped p-type or n-type conductivity, the dopant gas may be selected from the group consisting of bis-cyclopentadienyl-magnesium ($Cp_2Mg$), silane ($SiH_4$), disilane ($Si_2H_6$), germane ($GeH_4$), carbon tetrabromide ($CBr_4$) and combinations thereof.

The dopant that provides the n-type conductivity of the n-type conductivity gallium and nitride containing layer 10a or the n-type conductivity aluminum, gallium and nitride containing layer 10b may be present in a concentration ranging from $1\times10^{17}$ atoms/cm$^3$ to $1\times10^{20}$ atoms/cm$^3$. The dopant that provides the p-type conductivity of the p-type conductivity gallium and nitride containing layer 15a or the p-type conductivity of the p-type conductivity aluminum, gallium and nitride containing layer 15b may be present in a concentration ranging from $1\times10^{17}$ atoms/cm$^3$ to $1\times10^{20}$ atoms/cm$^3$.

The pitch of the pyramids, i.e., the pyramids of the textured surface of the substrate 5a', 5b' depicted FIGS. 1B and 2B, and the pitch of the pyramids of the n-type gallium nitride layer 10a, and n-type aluminum gallium nitride layer 10b depicted in FIGS. 1A, 2A, 3A and 3B, can be tuned through growth conditions or pre-patterning to maximize the light trapping for photovoltaic device. The preferred pyramid pitch is in the range of a few hundred nanometers, e.g., 100 nm to 500 nm, to match with the wavelength of the light that is subjected to the photovoltaic device 50. In some embodiments, the pitch for the texturing is selected so that the base of adjacent pyramids abut one another so that no portion of the pyramid surface is orthogonal to the direction of light incidence. This permits the most number of surface interactions with an incident source.

Following the formation of the lower layer of the p-n junction for the photovoltaic device 50, which is formed directly on the substrate 5a, 5b, 5a', 5b', the upper layer of the p-n junction may be formed using an epitaxial growth process. The epitaxial growth process that has been described above for forming the lower layer of the p-n junction is suitable for describing the epitaxial growth process for forming the upper layer of the p-n junction. The upper layer of the p-n junction has an opposite conductivity type as the lower layer of the p-n junction. The upper layer of the p-n junction may be referred to as having a second conductivity type. In the embodiment depicted in FIGS. 1A, 1B, 2A and 2B, the second conductivity type semiconductor material of a type III-V semiconductor is a p-type gallium nitride layer 15a having islands of a triangular geometry that is present on a silicon substrate 5a, 5a' and sapphire substrate 5b, 5b'. In FIGS. 3A and 3B, the second conductivity type semiconductor material of a type III-V semiconductor is an p-type aluminum gallium nitride layer 15b having islands of a triangular geometry that is present on a sapphire substrate 5b, 5b'. The triangular shaped geometry that is depicted in the cross-sections illustrated in FIGS. 1A, 1B, 2A, 2B, 3A and 3B may also be referred to as pyramids. The upper layer of the p-n junction can have a thickness ranging from 0.1 to 5 um thick.

After formation of the p-n junction for the photovoltaic device 50, the wafer can then be subjected to a high temperature anneal in nitrogen ($N_2$) to drive the residual hydrogen (H) out of the wafer thereby electrically activating material layers of the p-n junction for the photovoltaic device. Activation anneal may be conducted at a temperature ranging from 850° C. to 1350° C. Activation annealing may be provided by furnace annealing, rapid thermal annealing (RTA) or laser annealing.

The method may continue with forming the LED device 55 using a low hydrogen deposition process, such as MBE growth methods. The LED device 55 that is depicted in FIGS. 1A, 1B, 2A and 2B may be formed on the textured surface of the photovoltaic device 50. Further, because the material layers for the LED device 55 are formed using a conformal deposition process, e.g., conformal epitaxial growth, the texture provided by the upper surface of the photovoltaic device 50 is extended through the LED device 55 to provide that the LED device 55 includes a textured upper surface, e.g., textured light receiving surface.

It has been determined that hydrogen precursors can deactivate the electrically activated p-type dopant in the underlying p-type gallium nitride containing layers and/or p-type aluminum gallium containing nitride layers of the photovoltaic device 50. In the embodiment depicted in FIGS. 1A, 1B, 2A and 2B, the photovoltaic device 50 may include a p-type gallium nitride (p-type GaN) layer 15a and an n-type gallium nitride (n-type GaN) layer 10a. In the embodiment depicted in FIGS. 3A and 3B, the photovoltaic device 50 may include a p-type aluminum gallium nitride (p-type AlGaN) layer 15a and an n-type aluminum gallium nitride (n-type AlGaN) layer 10a. Therefore, the method for depositing the material layers for the LED 55 can employ a low-hydrogen containing process, e.g., deposition method using hydrogen free precursors, such as MBE, to protect the material layers of the underlying photovoltaic device 50.

In the embodiment that is depicted in FIGS. 1A, 1B, 2A and 2B, the LED device 55 may include a p-type gallium nitride containing layer 30a that is in direct contact with a first end of a multi quantum well 25a, and an n-type gallium nitride containing layer 20a that is direct contact with an opposing second end of the multi quantum well 25a. The p-type gallium nitride containing layer 30a of the LED device 55 may be referred to as a first cladding layer, and the n-type gallium nitride containing layer 20a may be referred to as a second cladding layer. In some embodiments, the first and second cladding layers, i.e., the p-type gallium nitride containing layer 30a and the n-type gallium nitride containing layer 20a of the LED 55, function to pump charge carriers, i.e., electron and hole charge carriers, into the intrinsic active area provided by the quantum well 25a of the LED 55. The dopant that provides the conductivity type, i.e., whether the gallium nitride containing layer 15a, 14 is n-type or p-type, may be present in a concentration ranging from $10^{17}$ atoms/cm$^3$ to $10^{20}$ atoms/cm$^3$. In some examples, the p-type gallium nitride containing layer 30a and the n-type gallium nitride containing layer 20a may have a thickness ranging from 100 nm to 2000 nm. It is noted that the above compositions and thicknesses are provided for illustrative purposes only, and are not intended to limit the present disclosure.

Still referring to FIGS. 1A, 1B, 2A and 2B, the active region of the LED device 55 is in the intrinsic (I) region, which is within the quantum well 25a. By "intrinsic" it is meant that the region is not doped with an extrinsic dopant, e.g., n-type or p-type dopant, such as the dopants used to dope the first and second cladding layers, i.e., the p-type gallium nitride containing layer 30a and the n-type gallium nitride containing layer 20a. The active region in the quantum well structure is formed by alternating layers of relatively low bandgap material and layers of relatively high bandgap material. As used herein, a "low bandgap" is a bandgap ranges from 0.5 eV to 3.0 eV, and a "high bandgap"

ranges from 3.1 eV to 3.5 eV. The former layers are termed "well layers" and the latter layers are termed "barrier layers." For example, for the quantum well 25a, e.g., multi-quantum well, the material layers providing the relatively high bandgap material may be gallium nitride (GaN), and the material layers having the relatively low bandgap material may be indium gallium nitride (InGaN). Indium gallium nitride (InGaN) has a band gap of approximately 2.7 eV, while gallium nitride (GaN) has a band gap of approximately 3.4 eV.

To provide the stacked structure of quantum wells, the thickness of each layer of semiconductor material within the quantum well may be no greater than 50 nm. For example, the thickness for each layer of the III-V compound semiconductor material, e.g., high band gap GaN and/or low band gap InGaN, within the quantum well 25a may range from 5 nm to 10 nm. In some embodiments, the stacked structure of quantum wells may be composed of 1 to 100 layers of semiconductor material, such as III-V compound semiconductor materials, e.g., the high band gap GaN and/or low band gap InGaN. In yet another embodiment, the stacked structure of quantum wells 25a may be composed of 1 to 5 layers of semiconductor material layers. The active region consisting of one or more indium gallium nitride (InGaN) including quantum wells 25a sandwiched between thicker layers of gallium nitride (GaN), i.e., cladding layers 30a, 20a, may provide an LED 55 that provides for blue light emission. For example, the LED device 55 that is depicted in FIGS. 1A, 1B, 2A and 2B may emit light having a wavelength of approximately 450 nm.

The LED device 55 depicted in FIGS. 3A and 3B is similar to the LED device 55 that is depicted in FIGS. 1A, 1B, 2A and 2B. The LED device 55 includes cladding layers 30b, 20b composed of p-type aluminum gallium nitride and n-type aluminum gallium nitride, while the quantum wells 25b are composed of layers intrinsic gallium nitride and intrinsic aluminum gallium nitride. Aluminum gallium nitride (AlGaN) has a band gap of approximately 4.0 eV, while gallium nitride (GaN) has a band gap of approximately 3.4 eV. The material layers of the LED device 55 that is depicted in FIGS. 3A and 3B is similar to the material layers of the LED device 55 that is depicted in FIGS. 1A, 1B, 2A and 2B. Therefore, the dopant concentrations and thicknesses for the material layers of the LED device 55 that is depicted in FIGS. 1A, 1B, 2A and 2B are suitable for describing these features of one embodiment of the LED device 55 that is depicted in FIGS. 3A and 3B that is depicted in FIGS. 3A and 3B.

The epitaxial forming method for the material layers for the LED device 55 depicted in FIGS. 1A, 1B, 2A, 2B, 3A and 3C is similar to the epitaxial forming method for the material layers of the photovoltaic device 50 depicted in FIGS. 1A, 1B, 2A, 2B, 3A, 3B and 3C. For example, the material layers for the LED device 55 depicted in FIGS. 1A, 1B, 2A, 2B, 3A and 3C may be formed using a conformal low-hydrogen epitaxial deposition process. Examples of epitaxial deposition processes suitable for forming the LED device 55 are described above in the description of the epitaxial deposition processes for forming the photovoltaic device 50.

A second activation anneal may be formed after the formation of the LED device 55. The activation anneal may be conducted at a temperature ranging from 850° C. to 1350° C. Activation annealing may be provided by furnace annealing, rapid thermal annealing (RTA) or laser annealing.

The material layers for the LED device 55 and the photovoltaic device 5 may be patterned and etched using photolithography and etch processes. For example, a photoresist mask may be formed on the uppermost semiconductor layer by applying a photoresist layer, exposing the photoresist layer to a pattern of radiation, and then developing the pattern into the photoresist layer utilizing conventional resist developer. In some embodiments, the block masks have a thickness ranging from 100 nm to 300 nm. The exposed portions of the semiconductor material layers that provide the upper and lower junctions may then be etched using an etch process, such as an anisotropic etch, e.g., reactive ion etch (RIE), or an isotropic etch, such as a wet chemical etch. In some embodiments, a first pattern and etch sequence including a first etch mask may be used to define the geometry of the upper junction; and a second pattern and etch sequence including a second etch mask may be used to define the geometry of the lower junction.

Thereafter, the contacts 21, 22, 31, 32 may be formed to each of the upper and lower junctions, i.e., photovoltaic device 10, 10a, 10b and the LED 15, 15a, 15b, using deposition, photolithography and etching processes. For example, a metal layer can be deposited using a physical vapor deposition (PVD) process. The PVD process may include plating, electroplating, electroless plating and combinations thereof. The deposited metal layers may be patterned and etched using deposition, photolithography and etching to provide the desired geometry of the contacts 21, 22, 31, 32.

The above noted process sequence provides a photovoltaic device 50 atop a substrate, in which a LED device 55 is present at the photovoltaic device 50 at the light receiving end of the device, which is applicable to FIGS. 1A, 1B, 2A, 2B, 3A and 3B.

FIGS. 1C and 2C depict an embodiment in which the LED device 55 is formed directly atop the substrate 5a, 5b, and the photovoltaic device 50 is then formed atop the LED device 55. The structures having reference numbers depicted in FIGS. 1C and 2C that are the same as the reference numbers in FIGS. 1A and 2A are similar structures. Therefore, the description for the structures depicted in FIGS. 1A and 2A having the same reference numbers in FIGS. 1C and 2C may provide the description of the same labeled structures in FIGS. 1C and 2C. To provide the structures depicted in FIGS. 1C and 2C, the process may begin with the prepared substrate 5a, 5a', 5b, 5b', and epitaxially form the p-type gallium nitride layer 30a on the substrate using a deposition process, such as CVD or MBE, which can be a low-hydrogen deposition process. The p-type gallium nitride layer 30a may be formed on a textured surface of a substrate 5a', 5b', or may be formed using the above described two stage process that produces a plurality of triangular geometry islands of p-type gallium nitride on a planar surface of the substrate 5a, 5b. The p-type gallium nitride layer 30a may provide the first cladding layer of the LED device 55. Thereafter, a quantum well 25a may be epitaxially formed using a conformal deposition process that may also be a low-hydrogen process. Due to the conformal nature of the epitaxial growth process, the textured surface first provided by the textured surface of the substrate or the textured surface of the p-type gallium nitride layer 30a is extended through the quantum well 25a.

In the embodiments depicted in FIGS. 1C and 2C, the next deposited layer may provide the second cladding layer of the LED device 55 and the first doped layer for the junction of the overlying photovoltaic device 50, which may be an n-type gallium nitride layer 15a. Similar to the previously deposited semiconductor material layers depicted in FIGS. 1C and 2C, the n-type gallium nitride layer 15a may be epitaxially formed using a conformal deposition process that may also be a low-hydrogen process. Due to the conformal nature of the epitaxial growth process, the textured surface first provided by the textured surface of the substrate or the textured surface of the p-type gallium nitride layer 30a is extended through the n-type gallium nitride layer 15a. The second doped layer of the photovoltaic device 10a may then be formed. For example, the second doped layer of the photovoltaic device 10a may be formed using a conformal epitaxial growth process, which can be a low-hydrogen process. Due to the conformal nature of the epitaxial growth process, the textured surface first provided by the textured surface of the substrate or the textured surface of the p-type gallium nitride layer 30a is extended through the p-type gallium nitride layer 10a. It is noted that further details of the epitaxial growth process for forming the material layers for the photovoltaic device 50 and LED device 55 that are depicted in FIGS. 1C and 2C, are provided in the above description of the method for forming the photovoltaic device 50 and the LED device 55 that are depicted in FIGS. 1A, 1B, 2A, 2B, 3A and 3B.

The LED device 55 depicted in FIGS. 1C and 2C is at the light receiving end of the device. Similar to the embodiments described above with reference to FIGS. 1A, 1B, 2A, 2B, 3A, and 3B, contacts are formed to each of the photovoltaic device 50 and the LED device 55 depicted in FIGS. 1C and 2C. The contacts 21, 22, 31, 32 to the LED device 55 and the photovoltaic device 50 that are depicted in FIGS. 1C and 2C are described in greater detail with reference to FIGS. 1A, 1B, 2A, 2B, 3A and 3B.

It is noted that a device including an LED 55 composed of aluminum gallium nitride cladding layers, and a quantum well of gallium nitride and aluminum gallium nitride, as well as a photovoltaic device composed of aluminum gallium nitride, as depicted in FIGS. 3A and 3B may be formed so that the LED 55 of the device is closer to the light receiving end of the device than the photovoltaic device 50 similar to the device geometries depicted in FIGS. 1C and 2C.

FIG. 1A depicts showing one embodiment of an electrical device including a photovoltaic device 50 having a textured upper surface, in which the junction for the photovoltaic device 50 includes a continuous layer of n-type gallium nitride islands 10a having a triangular shaped geometry atop a silicon containing substrate 5a and a conformal p-type gallium nitride layer 15a atop the n-type gallium nitride islands, wherein a light emitting diode 55 composed of a gallium nitride cladding layers 20a, 30a and a quantum well 25a of gallium nitride and indium gallium nitride is present atop the photovoltaic device 50.

FIG. 1B is similar to FIG. 1A with the exception that the substrate 5a' is textured.

FIG. 1C depicts another embodiment of an electronic device including a photovoltaic device 50 and a light emitting diode device 55 in a material stack atop a silicon containing substrate 5a, wherein the photovoltaic device 50 is composed of material layers of gallium nitride 10a, 15a, and the light emitting diode is composed of a gallium nitride cladding layers 20a, 30a and a quantum well 25a of gallium nitride and indium gallium nitride, wherein the photovoltaic device 50 is closer to the light receiving end S1 of the material stack.

The photovoltaic device 50 depicted in FIGS. 1A-1C may include produce a voltage greater than 2.0 V, e.g., 2.5 V or greater, when subjected to a light source having a wavelength ranging from 300 nm to 400 nm, e.g., 350 nm. The voltage of approximately 2.0 volts is suitable for powering the light emitting diode for emitting a light L1 having a wavelength ranging from 400 nm to 500 nm, e.g., 450 nm.

FIG. 2A depicts one embodiment of an electronic device including a photovoltaic device 50 having a textured upper surface, in which the junction for the photovoltaic device 50 includes a continuous layer of n-type gallium nitride islands 10a having a triangular shaped geometry atop a substrate composed of sapphire 5b and a conformal p-type gallium nitride layer 15a atop the n-type gallium nitride islands, wherein a light emitting diode 55 composed of a gallium nitride cladding layers and a quantum well of gallium nitride and indium gallium nitride is present atop the photovoltaic device 55. In the embodiment depicted in FIG. 2A, the light receiving end S2 of the device may be the sapphire substrate 5b. Light may be emitted in one direction L1 through the glass substrate 4 and a second direction L2 through the sapphire substrate.

FIG. 2B is similar to FIG. 2A with the exception that the substrate 5b' is textured.

FIG. 2C depicts another embodiment of an electronic device including a photovoltaic device 50 and a light emitting diode device 55 in a material stack atop a sapphire substrate 5b, wherein the photovoltaic device is composed of material layers of gallium nitride 10a, 10b, and the light emitting diode 55 is composed of a gallium nitride cladding layers 20a, 30a and a quantum well 35a of gallium nitride and indium gallium nitride, wherein the photovoltaic device is closer to the light receiving end S2 of the material stack.

The photovoltaic device 50 depicted in FIGS. 2A-2C may include produce a voltage greater than 2.0 V, e.g., 2.5 V or greater, when subjected to a light source having a wavelength ranging from 300 nm to 400 nm, e.g., 350 nm. The voltage of approximately 2.0 volts is suitable for powering the light emitting diode for emitting a light L1, L2 having a wavelength ranging from 400 nm to 500 nm, e.g., 450 nm.

FIG. 3A depicts another embodiment of an electronic device including a photovoltaic device 50 having a textured upper surface, in which the junction for the photovoltaic device 50 includes a continuous layer of n-type aluminum gallium nitride islands 10b having a triangular shaped geometry atop a silicon substrate 5a and a conformal p-type aluminum gallium nitride layer 15b atop the n-type aluminum gallium nitride islands, wherein a light emitting diode 55 composed of an aluminum gallium nitride cladding layers 20b, 30b and a quantum well 25b of gallium nitride and aluminum gallium nitride is present atop the photovoltaic device 50. The light receiving end S1 includes the glass substrate 4. The photovoltaic device 50 may produce a voltage greater than 2.5 V, e.g., 3.0 V or greater, when subjected to a light wavelength of ranging from 200 nm to 300 nm, e.g., 250 nm. The light L1 emitted by the LED device 50 may be have a wavelength ranging from 300 nm to 400 nm, e.g., 350 nm.

FIG. 3b depicts another embodiment of an electronic device including a photovoltaic device 50 having a textured upper surface, in which the junction for the photovoltaic device 50 includes a continuous layer of n-type aluminum gallium nitride islands 10b having a triangular shaped geometry atop a sapphire substrate 5b and a conformal p-type aluminum gallium nitride layer 15b atop the n-type aluminum gallium nitride islands, wherein a light emitting diode 55 composed of an aluminum gallium nitride cladding layers 20b, 30b and a quantum well 25b of gallium nitride and aluminum gallium nitride is present atop the photovoltaic device 50. The light receiving end S2 includes the sapphire substrate 5. The photovoltaic device 50 may produce a voltage greater than 2.5 V, e.g., 3.0 V or greater, when subjected to a light wavelength of ranging from 200 nm to 300 nm, e.g., 250 nm. The light L1, L2 emitted by the LED device 50 may be have a wavelength ranging from 300 nm to 400 nm, e.g., 350 nm.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of photovoltaic device and light emitting diodes that can be in integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. An electrical device comprising:
   a first conductivity type semiconductor layer of a type III-V semiconductor deposited on a substrate in a plurality of raised islands having triangular cross-sections;
   a second conductivity type semiconductor layer of a type III-V semiconductor deposited on the plurality of raised islands to form a textured surface; and
   a light emitting diode formed on the textured surface.

2. The electrical device of claim 1, wherein the substrate has a planar upper surface.

3. The electrical device of claim 1, wherein the substrate is comprised of silicon, the first conductivity type is n-type, the second conductivity type is p-type and the type III-V semiconductor is gallium nitride.

4. The electrical device of claim 1, wherein the substrate is comprised of sapphire, the first conductivity type is n-type, the second conductivity type is p-type and the type III-V semiconductor is gallium nitride.

5. The electrical device of claim 1, wherein the substrate is comprised of silicon, the first conductivity type is n-type, the second conductivity type is p-type and the type III-V semiconductor is aluminum gallium nitride.

6. The electrical device of claim 1, wherein the substrate is comprised of sapphire, the first conductivity type is n-type, the second conductivity type is p-type and the type III-V semiconductor is aluminum gallium nitride.

7. The electrical device of claim 1, wherein the substrate is comprised of silicon, the first conductivity type is n-type, the second conductivity type is p-type and the type III-V semiconductor is aluminum nitride.

8. The electrical device of claim 1, wherein the substrate is comprised of sapphire, the first conductivity type is n-type, the second conductivity type is p-type and the type III-V semiconductor is aluminum nitride.

9. An electrical device comprising:
   a plurality of triangular shaped peaks formed on a substrate;
   a first conductivity type semiconductor layer of a type III-V semiconductor deposited on the triangular shaped peaks;
   a second conductivity type semiconductor layer of a type III-V semiconductor deposited on the triangular shaped peaks to form a textured surface;
   a light emitting diode formed on the textured surface.

10. The electrical device of claim 9, wherein the substrate is comprised of silicon, the first conductivity type is n-type, the second conductivity type is p-type and the type III-V semiconductor is gallium nitride.

11. The electrical device of claim 9, wherein the substrate is comprised of sapphire, the first conductivity type is n-type, the second conductivity type is p-type and the type III-V semiconductor is gallium nitride.

12. The electrical device of claim 9, wherein the substrate is comprised of silicon, the first conductivity type is n-type, the second conductivity type is p-type and the type III-V semiconductor is aluminum gallium nitride.

13. The electrical device of claim 9, wherein the substrate is comprised of sapphire, the first conductivity type is n-type, the second conductivity type is p-type and the type III-V semiconductor is aluminum gallium nitride.

14. The electrical device of claim 9, wherein the substrate is comprised of silicon, the first conductivity type is n-type, the second conductivity type is p-type and the type III-V semiconductor is aluminum nitride.

15. The electrical device of claim 9, wherein the substrate is comprised of sapphire, the first conductivity type is n-type, the second conductivity type is p-type and the type III-V semiconductor is aluminum nitride.

16. An electrical device comprising:
    a layer of type III-V semiconductor having a second conductivity type deposited on a plurality of triangular shaped islands of a first conductivity type semiconductor for a textured surface of a photovoltaic device; and
    a light emitting diode formed on the textured surface of the photovoltaic device.

17. The electrical device of claim 16, wherein the first conductivity type is n-type, the second conductivity type is p-type and the type III-V semiconductor is gallium nitride.

18. The electrical device of claim 16, wherein the first conductivity type is n-type, the second conductivity type is p-type and the type III-V semiconductor is aluminum gallium nitride.

19. The electrical device of claim 16, wherein the plurality of triangular shaped islands of the first conductivity type semiconductor is present on a substrate that is comprised of sapphire.

20. The electrical device of claim 16, wherein the plurality of triangular shaped islands of the first conductivity type semiconductor is present on a substrate that is comprised of silicon.

* * * * *